US008923567B2

(12) United States Patent
Yao et al.

(10) Patent No.: US 8,923,567 B2
(45) Date of Patent: Dec. 30, 2014

(54) APPARATUS AND METHOD FOR PREDICTING SOLAR IRRADIANCE VARIATION

(75) Inventors: Yi Yao, Niskayuna, NY (US); Peter Tu, Niskayuna, NY (US); Ming-Ching Chang, Niskayuna, NY (US); Li Guan, Niskayuna, NY (US); Yan Tong, Chapin, SC (US)

(73) Assignee: General Electric Company, Niskayuna, NY (US)

( * ) Notice: Subject to any disclaimer, the term of this patent is extended or adjusted under 35 U.S.C. 154(b) by 356 days.

(21) Appl. No.: 13/329,450

(22) Filed: Dec. 19, 2011

(65) Prior Publication Data

US 2013/0152997 A1 Jun. 20, 2013

(51) Int. Cl.
*G06K 9/00* (2006.01)

(52) U.S. Cl.
USPC .................. 382/107; 382/103; 348/144

(58) Field of Classification Search
CPC ............... G06F 1/30; G06F 1/26; G06N 5/02; G06K 9/00; G06K 9/46; G06K 9/32; G01K 11/00; H04N 5/225; H01L 31/042
USPC ............... 136/246, 292; 700/286; 250/208.1, 250/208.6; 348/49, 143, 144, 223.1, 227.1, 348/655, 159, 169, 700; 382/103, 107, 113, 382/181, 190, 195, 293, 294
See application file for complete search history.

(56) References Cited

U.S. PATENT DOCUMENTS

| | | | |
|---|---|---|---|
| 5,710,875 A * | 1/1998 | Harashima et al. | 345/419 |
| 6,504,951 B1 * | 1/2003 | Luo et al. | 382/165 |
| 6,512,846 B1 | 1/2003 | Luo | |
| 6,542,846 B1 * | 4/2003 | Miller et al. | 702/132 |
| 8,446,468 B1 * | 5/2013 | Medioni et al. | 348/144 |
| 2003/0012430 A1 * | 1/2003 | Risson | 382/165 |
| 2004/0085451 A1 * | 5/2004 | Chang | 348/159 |

(Continued)

FOREIGN PATENT DOCUMENTS

| | | |
|---|---|---|
| EP | 2375755 A1 | 10/2011 |
| WO | 2009091237 | 7/2009 |
| WO | 2011124720 A2 | 10/2011 |

OTHER PUBLICATIONS

Search Report and Written Opinion from corresponding PCT Application No. PCT/US2012/070232 dated Aug. 20, 2013.

(Continued)

*Primary Examiner* — Chan Park
*Assistant Examiner* — Mia M Thomas
(74) *Attorney, Agent, or Firm* — Seema S. Katragadda

(57) ABSTRACT

An apparatus and method, as may be used for predicting solar irradiance variation, are provided. The apparatus may include a solar irradiance predictor processor (10) configured to process a sequence of images (e.g., sky images). The irradiance predictor processor may include a cloud classifier module (18) configured to classify respective pixels of an image of a cloud to indicate a solar irradiance-passing characteristic of at least a portion of the cloud. A cloud motion predictor (22) may be configured to predict motion of the cloud over a time horizon. An event predictor (24) may be configured to predict over the time horizon occurrence of a solar obscuration event. The prediction of the solar obscuration event may be based on the predicted motion of the cloud. The event predictor may include an irradiance variation prediction for the obscuration event based on the solar irradiance-passing characteristic of the cloud.

23 Claims, 3 Drawing Sheets

(56) References Cited

U.S. PATENT DOCUMENTS

| | | | |
|---|---|---|---|
| 2004/0125207 A1* | 7/2004 | Mittal et al. | 348/169 |
| 2004/0169770 A1* | 9/2004 | Widener et al. | 348/373 |
| 2005/0069201 A1* | 3/2005 | Speigle et al. | 382/167 |
| 2006/0013478 A1* | 1/2006 | Ito et al. | 382/167 |
| 2006/0126959 A1* | 6/2006 | Padwick et al. | 382/254 |
| 2006/0165312 A1* | 7/2006 | Odell | 382/291 |
| 2007/0084502 A1* | 4/2007 | Kelly et al. | 136/246 |
| 2008/0174863 A1* | 7/2008 | Whorton | 359/430 |
| 2009/0000653 A1* | 1/2009 | Edwards et al. | 136/244 |
| 2009/0273762 A1* | 11/2009 | Ohira | 353/62 |
| 2010/0002071 A1* | 1/2010 | Ahiska | 348/36 |
| 2010/0198420 A1* | 8/2010 | Rettger et al. | 700/291 |
| 2010/0309330 A1* | 12/2010 | Beck | 348/222.1 |
| 2011/0050854 A1* | 3/2011 | Kanamori et al. | 348/46 |
| 2011/0060475 A1 | 3/2011 | Baldwin et al. | |
| 2011/0091065 A1* | 4/2011 | Chandrashekar et al. | 382/100 |
| 2011/0220091 A1 | 9/2011 | Kroyzer | |
| 2011/0226907 A1* | 9/2011 | Robinson | 244/158.4 |
| 2012/0154584 A1* | 6/2012 | Omer et al. | 348/144 |
| 2013/0126706 A1* | 5/2013 | Lynass et al. | 250/208.1 |
| 2013/0223676 A1* | 8/2013 | Guan et al. | 382/103 |
| 2013/0258068 A1* | 10/2013 | Schmidt et al. | 348/49 |
| 2013/0317659 A1* | 11/2013 | Thomas et al. | 700/286 |

OTHER PUBLICATIONS

Long et al., Retrieving Cloud Characteristics from Ground-Based Daytime Color All-Sky Images, Journal of Atmospheric and Oceanic Technology, vol. 23, May 2006, pp. 633-652, American Meteorological Society, Richland, WA.

Heinemann et al., Forecasting of Solar Radiation, Oldenburg University, Institute of Physics, Energy and Semiconductor Research Laboratory, Energy Meteorology Group, pp. 1-10, Oldenburg, Germany.

Stiller et al., Estimating Motion in Image Sequences, IEEE Signal Processing Magazine 1053/5888/98, Jul. 1999, pp. 70-91, USA.

Gallup et al., Variable Baseline/Resolution Stereo, Computer Vision and Pattern Recognition, Jun. 23-28, 2008, pp. 1-8, Anchorage, AK.

Scaramuzza et al., A Toolbox for Easily Calibrating Omnidirectional Cameras, inria-00359941, version 1—Feb. 9, 2009, pp. 1-7, 2006, Iros.

Kreuter, All-sky imaging: a simple, versatile system for atmospheric research, 2009 Optical Society of America, Feb. 20, 2009/ vol. 48, No. 6 / Applied Optics, pp. 1091-1097.

Heinle et al., Automatic cloud classification of whole sky images, Atmospheric Measurement Techniques, Published by Copernicus Publications on behalf of the European Geosciences Union, May 2010, Atmos. Meas. Tech., 3, pp. 557-567.

Pfister et al., Cloud Coverage Based on All-Sky Imaging and Its Impact on Surface Solar Irradiance, 2003 American Meteorological Society, Oct. 2003, pp. 1421-1434, Boulder, CO.

Zhengyou Zhang, On the Epipolar Geometry Between Two Images With Lens Distortion, in Proc. Int'l Conf. Pattern Recognition (ICPR), vol. I, pp. 407-411, Aug. 1996, Vienna.

Klaus et. al., "Camera Calibration From a Single Night Sky Image, Computer Vision and Pattern Recognition", 2004. CVPR 2004. Proceedings of the 2004 IEEE Computer Society Conference, IISSN: 1063-6919, pp. I-151-I-157 vol. 1, Issue Date: Jun. 27-Jul. 2, 2004.

Barron et al., "Peformance of Optical Flow Techniques". International Journal of Computer Vision, 12:1, 43-77 (1994), © 1994 Kluwer Academic Publishers, Manufactured in The Netherlands.

Heinemann et al., "Forecasting of Solar Radiation", Oldenburg University, Institute of Physics, Energy and Semiconductor Research Laboratory, Energy Meteorology Group, pp. 1-10, 2005, Oldenburg, Germany.

Kassianov et al., "Cloud-Based Height Estimation from Paired Ground-Based Hemispherical Observations," Journal of Applied Meteorology, vol. 44, pp. 1221-1233 (Aug. 2005).

Allmen et al., "The computation of cloud base height from paired whole-sky imaging cameras," Machine Vision and Applications, vol. 9, pp. 160-165 (1997).

Chow et al., "Intra-hour forecasting with a total sky imager at the UC San Diego solar energy testbed," Solar Energy, vol. 85, pp. 2881-2893 (2011).

Seiz, "Ground- and Satellite-Based Multi-view Photogrammetric Determination of 3D Cloud Geometry," Doctoral Dissertation, Swiss Federal Institute of Technology Zurich, Diss. ETH No. 15172 (2003).

\* cited by examiner

APPARATUS AND METHOD FOR PREDICTING SOLAR IRRADIANCE VARIATION

FIELD

The present invention is generally related to power generation, as may involve a power generation system for generating electrical power, which varies in response to solar irradiance, and, more particularly, to an apparatus and techniques for predicting solar irradiance variation.

BACKGROUND

Large-scale generation of electric power based on a freely-available, essentially inexhaustible natural resource, such as solar irradiance, continues progressing as an attractive modality for clean and efficient generation of electric power.

The weather-induced variability of the natural resource (e.g., due to cloud coverage variability in the case of solar irradiance) may cause challenges at various levels, such as at a component level, at a subsystem level, at a distribution level as well as on the larger power grid. Known cloud tracking devices may either lack accurate tracking of cloud shape and movement or may be relatively costly.

Accordingly, there is a need for an improved apparatus and/or techniques, which at a relatively low cost may accurately and reliably predict solar irradiance variation.

BRIEF DESCRIPTION

Aspects of the present invention may be fulfilled by an apparatus including a solar irradiance predictor processor configured to process a sequence of images. The irradiance predictor processor may include a cloud classifier module configured to classify respective pixels of an image of at least one cloud to indicate a solar irradiance-passing characteristic of at least a portion of the cloud. A cloud motion predictor may be configured to predict motion of the cloud over a time horizon. An event predictor may be configured to predict over the time horizon occurrence of a solar obscuration event. The prediction of the solar obscuration event may be based on the predicted motion of the cloud. The event predictor may include an irradiance variation prediction for the obscuration event based on the solar irradiance-passing characteristic of the cloud.

Further aspects of the present invention may be fulfilled by an apparatus including a solar irradiance predictor processor configured to process a sequence of images. The irradiance predictor processor may include a cloud motion predictor configured to predict over a time horizon motion of the cloud. An event predictor may be configured to predict irradiance variation by back-projecting a solar disk image based on an average speed vector computed from the predicted motion of the cloud.

Yet further aspects of the present invention may be fulfilled by a power generation system including a plurality of power generators responsive to solar irradiance. The plurality of power generators may be disposed over respective positions on a field. At least one image acquisition device may be arranged to acquire a sequence of images. An irradiance predictor processor may be coupled to the image acquisition device to process the sequence of images. The irradiance predictor processor may include a cloud classifier module configured to classify respective pixels of an image of at least one cloud to indicate a solar irradiance-passing characteristic of at least a portion of the cloud. A cloud motion predictor may be configured to predict over a time horizon motion of the cloud. An event predictor may be configured to predict over the time horizon occurrence of a solar obscuration event. The prediction of the solar obscuration event may be based on the predicted motion of the cloud. The event predictor may include an irradiance variation prediction for the obscuration event based on the solar irradiance-passing characteristic of the cloud. A controller may be responsive to the event predictor to adjust a control strategy for at least one component and/or subsystem of the power generation system based on the predicted occurrence of the obscuration event.

Yet other aspects of the present invention may be fulfilled by a method for predicting over a time horizon solar irradiance variation. The method may allow processing a sequence of images. The processing may include classifying respective pixels of an image of at least one cloud to indicate a solar irradiance-passing characteristic of at least a portion of the cloud. The processing may further include predicting over the time horizon motion of the cloud, and predicting over the time horizon an occurrence of a solar obscuration event. The prediction of the solar obscuration event may be based on the predicted motion of the cloud. The prediction of the solar obscuration event may include an irradiance variation prediction for the obscuration event based on the solar irradiance-passing characteristic of the cloud.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
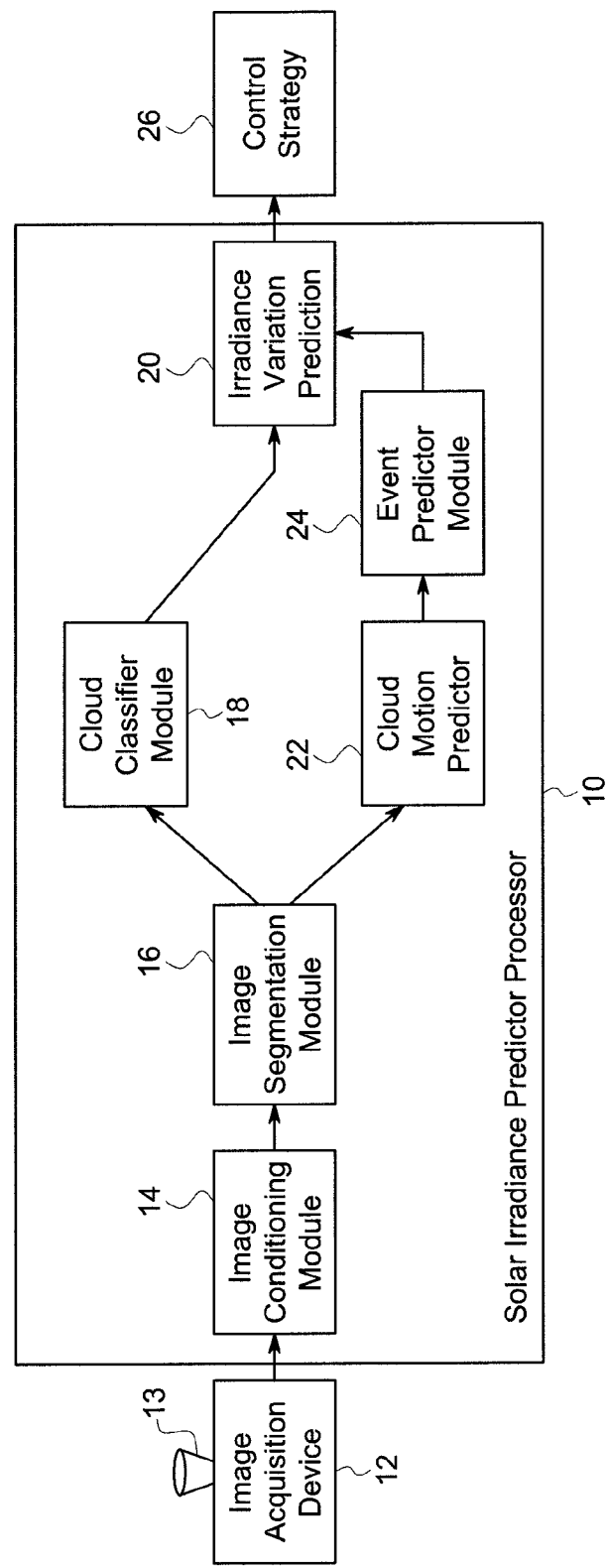
FIG. 1 is a block diagram representation including an example embodiment of an apparatus embodying aspects of the present invention, as may be used for predicting solar irradiance variation due to cloud coverage.

FIG. 1 is a block diagram representation including an example embodiment of an apparatus embodying aspects of the present invention, as may be used for predicting solar irradiance variation due to cloud coverage. In one example embodiment, a solar irradiance predictor processor 10 may be configured to process a sequence of images, (e.g., sky images) as may include images of one or more clouds. An image acquisition device 12, such as a consumer camera, an industrial camera, a more advanced sky imager, etc., may be coupled to processor 10 to acquire the sequence of images.

In one example embodiment, image acquisition device 12 may include a wide-angle field of view optics 13. For example, a group of image acquisition devices 12 so equipped may encompass a given field of view with a relatively smaller number of cameras. An image conditioning module 14 may be optionally provided to compensate for optical distortion, (e.g., radial distortion) which may be introduced by the wide-angle field of view optics. It will be appreciated that aspects of the present invention are neither limited to any particular kind of image acquisition device nor to the use of wide-angle field of view optics.

In one example embodiment, irradiance predictor processor 10 may include an image segmentation module 16, as may be configured to identify at least a cloud segment and/or a sky segment for the image including the one or more clouds. In one example embodiment, the segmentation may be performed at the pixel level. That is, each pixel may be assigned a respective label indicative of whether or not the pixel is likely to correspond to a cloud.

A cloud classifier module 18 may be configured to classify respective pixels of the image of the one or more clouds to indicate a solar irradiance-passing characteristic of at least a portion of the one or more clouds. The effect of clouds on solar irradiance variation may depend on various factors, such as cloud volume (e.g., thickness), water vapor content, etc. For example, if the sun is obscured by thicker, darker clouds, a solar irradiance drop would be relatively larger compared to solar obscuration by thinner, lighter clouds.

In one example embodiment, cloud classifier module 18 may be configured to identify at least three different types of clouds, such as high-transparency clouds, middle-transparency clouds and low-transparency clouds. This classification may be performed at the pixel level. That is, each pixel associated with a cloud may be assigned a respective label indicative of the cloud type, such as high-transparency cloud, middle-transparency cloud or low-transparency cloud. It will be appreciated that aspects of the present invention are not limited to a specific number of cloud classifications since the number of cloud classifications may be adjusted based on the needs of a given application.

A cloud motion predictor 22 may be configured to predict motion of the clouds over a time horizon. In one example embodiment, the motion prediction computed by cloud motion predictor 22 may be based on a flow motion model (e.g., optical flow). Although aspects of the present invention are not limited to optical flow, it is believed that optical flow may be a suitable tool for cloud tracking since optical flow is capable of handling non-rigid objects, which, for example, may allow accommodating substantial cloud deformation. For example, this may allow computing cloud motion changes for every pixel between two images, which may be used to estimate cloud boundary velocity, such as may involve a plurality of cloud boundary velocity vectors.

Figure 2:
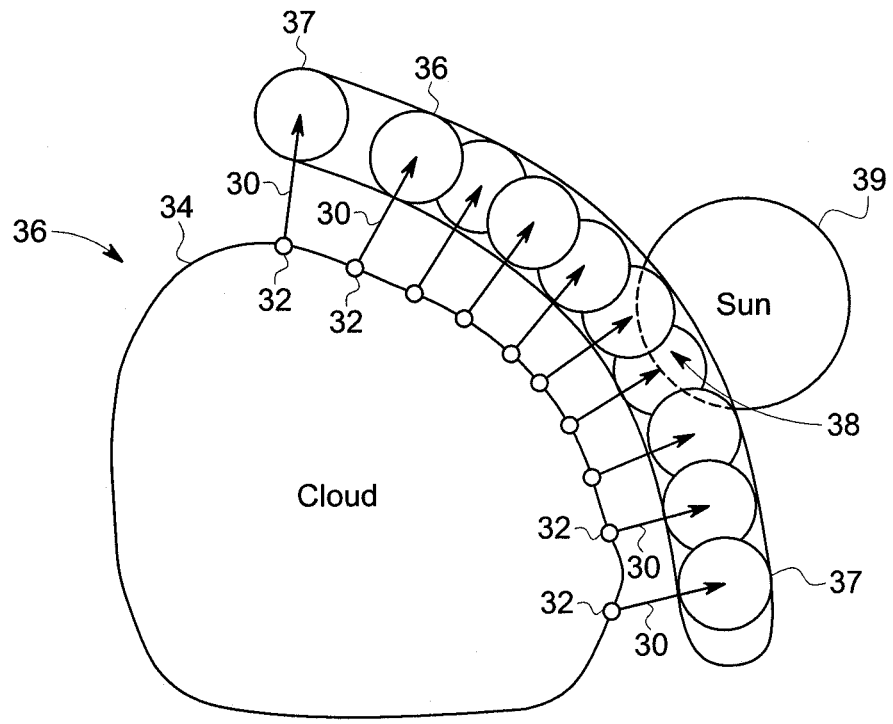
FIG. 2 is a schematic representation in connection with example concepts of cloud movement prediction (e.g., cloud front prediction) embodying aspects of the present invention.

For example, as illustrated in FIG. 2, arrows 30 may represent a plurality of velocity vectors estimated at a $t^{th}$ frame at a number of points 32 disposed on a boundary 34 of a cloud 36. Once the cloud boundary velocity vectors 30 have been estimated at the $t^{th}$ frame, one may then predict likely locations 37 of the cloud boundary (e.g., cloud front) at a subsequent $t+\Delta t^{th}$ frame, where $\Delta t$ represents an example prediction interval.

An event predictor module 24 (FIG. 1) may be configured to predict over the time horizon occurrence of a solar obscuration event, as may be conceptually represented by an area 38 in FIG. 2, which represents an overlap (intersection) of the solar disk 39 and a predicted location of at least a portion of cloud 36. Thus, the prediction of the solar obscuration event may be based on the predicted motion of the one or more clouds. In one example embodiment, the time horizon may range from approximately several seconds (in the order of approximately five seconds) to approximately several minutes (e.g., in the order of approximately five minutes or more). It will be appreciated that aspects of the present invention are not limited to any specific time horizon since in a practical application the prediction time horizon may involve various tradeoff considerations, such as for example the time horizon should be sufficiently long so that an appropriate control strategy may be timely implemented. Conversely, the time horizon should be sufficiently short so that the degree of uncertainty associated with a prediction event is kept within reasonable bounds.

Returning to FIG. 1, as represented by block 20, the event prediction may include an irradiance variation prediction for the obscuration event, which may be based on the solar irradiance-passing characteristic of the one or more clouds. For example, this may be based on the cloud classification performed by cloud classifier module 18, such as high-transparency cloud, middle-transparency cloud or low-transparency cloud. Thus, in accordance with aspects of the present invention, the event prediction—in addition to predicting a time when an obscuration event is likely to occur—may further include information regarding a predicted irradiance variation.

It will be appreciated that in principle one could use the foregoing approach (as described above in the context of cloud boundary position prediction) to predict the position of an entire cloud. However, since in the real world clouds may generally experience substantial deformation, in a practical embodiment it may be computationally burdensome to estimate and interpolate the positions of every cloud pixel to predict the position of an entire cloud.

Figure 3:
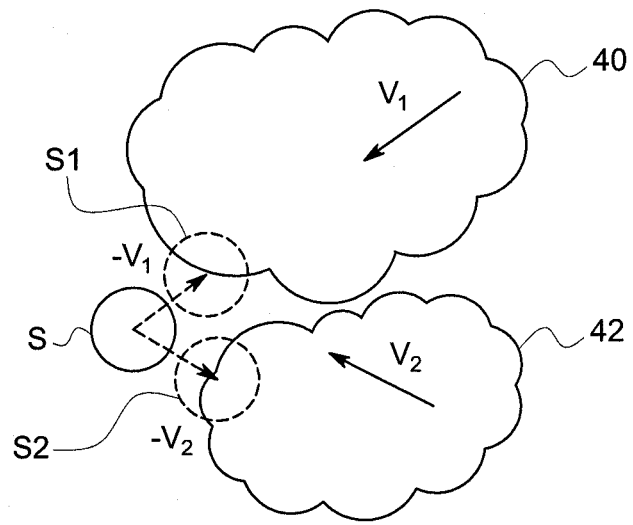
FIG. 3 is a schematic representation in connection with example concepts of irradiance variation prediction (e.g., as may involve back projecting a solar disk image based on an average speed vector computed from the cloud movement prediction) embodying further aspects of the present invention.

Accordingly, the inventors of the present invention have recognized the relative stable shape of the solar disk (solar image), and have made use of such characteristic to innovatively solve the foregoing issue by performing a back projection of a solar disk image based on an estimated average velocity of the cloud. For example, FIG. 3 illustrates two example cloud regions (e.g., cloud blobs) 40 and 42. Vector $V_1$ represents an average speed for cloud region 40 and vector $V_2$ represents an average speed for cloud region 42. The average speed may be computed based on the respective velocity vectors of boundary points proximate to the solar disk.

As further illustrated in FIG. 3, dashed circle S1 represents an example solar disk image, which is back projected from an initial position represented by solid circle S with respect to cloud region 40, (by way of average velocity vector $-V_1$) based on the average speed for cloud region 40. That is, in this example case the average motion of cloud region 40 is attributed to the solar disk image. Similarly, dashed circle S2 represents another example solar disk image, which is back projected with respect to cloud region 42, (by way of average velocity vector $-V_2$) based on the average speed for cloud region 42. That is, in this example case the average motion of cloud region 42 is attributed to the solar disk image. This back projection aspect may be conceptually analogized to, for example, a vehicle moving north relative to a road at 60 km/hr, which from the point of view of a relativistic observer would be equivalent to the road moving south at 60 km/hr relative to the car. Accordingly, in one example embodiment, event predictor module 24 may be configured to predict the degree (e.g., irradiance variation) of the solar obscuration event by way of back projecting a solar disk image based on an average speed vector computed from the predicted motion of the one or more clouds.

Figure 4:
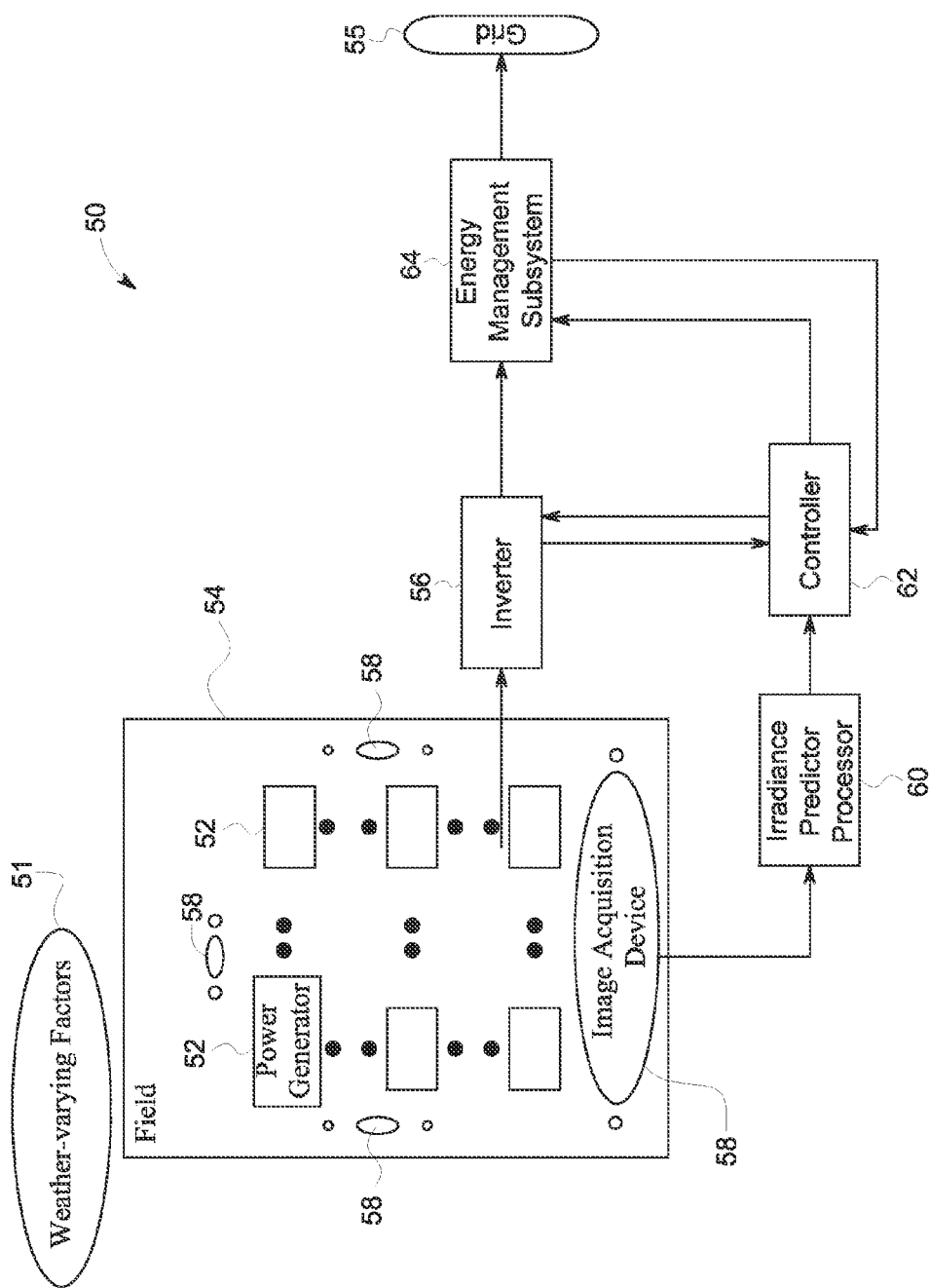
FIG. 4 is a schematic representation of an example embodiment of a power generation system responsive to solar irradiance for generating electrical power, as may include an apparatus embodying aspects of the present invention.

FIG. 4 is a schematic representation of an example embodiment of a power generation system 50 responsive to solar irradiance for generating electrical power, which may vary in response to weather-varying factors 51, such as cloud coverage, which directly affects solar irradiance. The description below should be construed as an example application of an apparatus embodying aspects of the present invention, as described above in the context of FIGS. 1-3. Accordingly, the description below should not be construed in a limiting sense since many other applications may be realizable with an apparatus embodying aspects of the present invention.

FIG. 4 illustrates an array of power generators 52, which may be subject to such weather-varying factor. In the example case where power generators 52 may comprise an array of photovoltaic (PV) modules, solar irradiance may for example vary based on varying cloud conditions, which can lead to changes in the power generating conditions of the array of photovoltaic modules. The array of power generators 52 may be disposed over respective locations (e.g., spaced-apart locations) on a field 54, such as a utility-scale solar farm, as may involve a relatively large surface area (e.g., potentially hundreds of acres).

In one example embodiment, one or more inverters 56 may be coupled to the array of power generators 52. For example, as will be appreciated by one skilled in the art, photovoltaic arrays naturally produce direct current (DC) power output when exposed to solar irradiance. Thus, in this example, one or more inverters may be used for converting the DC output from the photovoltaic array to an AC signal appropriate for coupling to a power grid 55.

One or more image acquisition devices 58 may be coupled to an irradiance predictor processor 60, which as described above may be configured in accordance with aspects of the present invention to predict over a time horizon a likely occurrence and irradiance variation regarding a solar obscuration event, which can affect a power-generating condition for the array of power generators 52. A controller 62 may be responsive to the event predictor processor 60 to adjust a control strategy 26 (FIG. 1) for at least one component (e.g., inverter 56) and/or subsystem (e.g., energy management subsystem 64) of the power generation system based on the predicted occurrence of the obscuration event.

It will be appreciated that aspects of an example inventive apparatus, as may be used for predicting solar irradiance variation and method disclosed herein may be implemented by any appropriate processor system using any appropriate programming language or programming technique. The system can take the form of a hardware embodiment, a software embodiment or an embodiment comprising both hardware and software elements. In one embodiment, the system may be implemented by way of software and hardware (e.g., processor, imaging sensors), which may include but is not limited to firmware, resident software, microcode, etc. Furthermore, parts of the processor system can take the form of a computer program product accessible from a computer-usable or computer-readable medium providing program code for use by or in connection with a computer or any instruction execution system. Examples of computer-readable media may include non-transitory tangible computer-readable media, such as a semiconductor or solid-state memory, magnetic tape, a removable computer diskette, a random access memory (RAM), a read-only memory (ROM), a rigid magnetic disk and an optical disk. Present examples of optical disks may include compact disk-read only memory (CD-ROM), compact disk-read/write (CD-R/W) and DVD. An interface display may be a tablet, flat panel display, PDA, or the like.

In one example embodiment, a processing system suitable for storing and/or executing program code may include in one example at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the presently available types of network adapters.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An apparatus comprising:
a solar irradiance predictor processor configured to process a sequence of images of the sky, wherein one or more images of the sequence of images comprise at least one cloud, the irradiance predictor processor comprising:
a cloud classifier module configured to classify respective pixels of a cloud segment in the one or more images comprising the at least one cloud to indicate a solar irradiance-passing characteristic of at least a portion of the at least one cloud;
a cloud motion predictor configured to predict motion of the at least one cloud over a time horizon based on the sequence of images; and
an event predictor configured to predict over the time horizon occurrence of a solar obscuration event, wherein the prediction of the solar obscuration event is based on the predicted motion of the at least one cloud, and wherein the event predictor is further configured to predict an irradiance variation for the solar obscuration event based on the solar irradiance-passing characteristic of the at least one cloud.

2. The apparatus of claim 1, wherein the irradiance predictor processor further comprises an image segmentation module configured to identify at least the cloud segment and/or a sky segment corresponding to the one or more images of the at least one cloud.

3. The apparatus of claim 1, wherein the cloud motion predictor is configured to predict the motion of the at least one cloud based on a flow motion model.

4. The apparatus of claim 1, wherein the event predictor is configured to predict the irradiance variation by back projecting a solar disk image based on an average speed vector computed from the predicted motion of the at least one cloud.

5. The apparatus of claim 1, further comprising at least one image acquisition device arranged to acquire the sequence of images.

6. The apparatus of claim 5, wherein the at least one image acquisition device comprises a wide-angle field of view optics.

7. The apparatus of claim 6, wherein the irradiance predictor processor further comprises an image conditioning module configured to compensate for optical distortion introduced by the wide-angle field of view optics.

8. The apparatus of claim 1, wherein the time horizon comprises a range from approximately several seconds to approximately several minutes.

9. Apparatus comprising:
a solar irradiance predictor processor configured to process a sequence of images of the sky, wherein one or more images of the sequence of images comprise at least one cloud, the irradiance predictor processor comprising:
a cloud motion predictor configured to predict over a time horizon motion of the at least one cloud based on the sequence of images; and
an event predictor configured to predict irradiance variation by back-projecting a solar disk image based on an average speed vector computed from the predicted motion of the at least one cloud.

10. The apparatus of claim 9, further comprising a cloud classifier module configured to classify respective pixels of the one or more images comprising the at least one cloud to indicate a solar irradiance-passing characteristic of at least a portion of the at least one cloud.

11. The apparatus of claim 10, wherein the event predictor is further configured to predict an irradiance variation for a solar obscuration event based on the solar irradiance-passing characteristic of the at least one cloud.

12. The apparatus of claim 9, wherein the irradiance predictor processor further comprises an image segmentation module configured to identify at least a cloud segment and/or a sky segment corresponding to the one or more images of the at least one cloud.

13. The apparatus of claim 9, wherein the cloud motion predictor is configured to predict the motion of the at least one cloud based on a flow motion model.

14. The apparatus of claim 9, further comprising at least one image acquisition device arranged to acquire the sequence of images.

15. The apparatus of claim 14, wherein the least one image acquisition device comprises a wide-angle field of view optics.

16. The apparatus of claim 15, wherein the irradiance predictor processor further comprises an image conditioning module configured to compensate for optical distortion introduced by the wide-angle field of view optics.

17. The apparatus of claim 9, wherein the time horizon comprises a range from approximately several seconds to approximately several minutes.

18. A power generation system comprising:
a plurality of power generators responsive to solar irradiance, wherein the plurality of power generators is disposed over respective positions on a field;
at least one image acquisition device arranged to acquire a sequence of images of the sky, wherein one or more images of the sequence of images comprise at least one cloud;
an irradiance predictor processor coupled to the at least one image acquisition device and configured to process the sequence of images, the irradiance predictor processor comprising:
a cloud classifier module configured to classify respective pixels of a cloud segment in the one or more images comprising the at least one cloud to indicate a solar irradiance-passing characteristic of at least a portion of the at least one cloud;
a cloud motion predictor configured to predict over a time horizon motion of the at least one cloud based on the sequence of images;
an event predictor configured to predict over the time horizon occurrence of a solar obscuration event, wherein the prediction of the solar obscuration event is based on the predicted motion of the at least one cloud, and wherein the event predictor is further configured to predict an irradiance variation for the solar obscuration event based on the solar irradiance-passing characteristic of the at least one cloud; and
a controller responsive to the event predictor to adjust a control strategy for at least one component and/or subsystem of the power generation system based on the predicted occurrence of the solar obscuration event.

19. The system of claim 18, wherein the irradiance predictor processor further comprises an image segmentation module configured to identify at least the cloud segment and/or a sky segment in the one or more images of the at least one cloud.

20. The system of claim 18, wherein the event predictor is configured to predict the irradiance variation by back projecting a solar disk image based on an average speed vector computed from the predicted motion of the at least one cloud.

21. A method for predicting over a time horizon solar irradiance variation, the method comprising:
processing a sequence of images of the sky, wherein one or more images of the sequence of images comprises at least one cloud, the processing comprising:
classifying respective pixels of a cloud segment in the one or more images comprising the at least one cloud to indicate a solar irradiance-passing characteristic of at least a portion of the at least one cloud;
predicting over the time horizon motion of the at least one cloud based on the sequence of images; and
predicting over the time horizon an occurrence of a solar obscuration event, wherein the prediction of the solar obscuration event is based on the predicted motion of the at least one cloud, and wherein the prediction of the solar obscuration event comprises predicting an irradiance variation for the solar obscuration event based on the solar irradiance-passing characteristic of the at least one cloud.

22. The method of claim 21, wherein the predicting the irradiance variation comprises back projecting a solar disk image based on an average speed vector computed from the predicted motion of the at least one cloud.

23. The method of claim 21, further comprising identifying at least a cloud segment and/or a sky segment in the one or more images of the at least one cloud.

* * * * *